United States Patent
Yokoyama et al.

(10) Patent No.: US 8,290,005 B2
(45) Date of Patent: Oct. 16, 2012

(54) METHOD OF DRIVING A LASER DIODE

(75) Inventors: Hiroyuki Yokoyama, Miyagi (JP);
Shunsuke Kono, Miyagi (JP);
Tomoyuki Oki, Miyagi (JP); Masao Ikeda, Kanagawa (JP); Takao Miyajima, Kanagawa (JP); Hideki Watanabe, Kanagawa (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 13/212,244

(22) Filed: Aug. 18, 2011

(65) Prior Publication Data
US 2012/0002690 A1    Jan. 5, 2012

Related U.S. Application Data

(63) Continuation of application No. 12/506,713, filed on Jul. 21, 2009.

(30) Foreign Application Priority Data

Jul. 29, 2008    (JP) ................................ 2008-194373

(51) Int. Cl.
*H01S 3/13* (2006.01)
(52) U.S. Cl. ................................................ 372/29.014
(58) Field of Classification Search ............... 372/29.01, 372/25, 38.01, 70
See application file for complete search history.

(56) References Cited

U.S. PATENT DOCUMENTS

| | | | |
|---|---|---|---|
| 4,400,812 A * | 8/1983 | Clark et al. ................. | 372/38.02 |
| 5,400,351 A | 3/1995 | Montgomery et al. | |
| 5,987,045 A | 11/1999 | Albares et al. | |
| 6,292,500 B1 | 9/2001 | Kouchi et al. | |
| 8,081,669 B2 * | 12/2011 | Yokoyama et al. ............. | 372/25 |
| 2004/0120363 A1 | 6/2004 | Siepmann | |
| 2005/0117616 A1 * | 6/2005 | Yamasaki et al. ............... | 372/44 |
| 2010/0027573 A1 * | 2/2010 | Yokoyama et al. ........ | 372/38.02 |
| 2010/0098119 A1 * | 4/2010 | Schemmann et al. .......... | 372/25 |

OTHER PUBLICATIONS

Bartram, M. & D. Hoffman, "New soft-switching Current-Pulse Power-Supply offers more than 500 A Current Pulses with Pulsewidth less than 100 ns to explore new Applications with high-power Laser Diode Arrays", Official Proceedings of the International Conferences Power Electronics, Intelligent Motion, Power Quality, PCIM Europe 2002, XX, XX, May 14, 2002, pp. 459-464.
European Patent Office, European Search Report for EP Application No. 09009752.8, Munich, Germany, Jan. 5, 2010.
J. Ohya et al.; Picosecond Blue Light Pulse Generation by Frequency Doubling of a Gain-Switched GaAlAs Laser Diode With Saturable Absorbers; Appl. Phys. Lett. 56, p. 2270; 1990.
J. Auyeung et al; Picosecond Optical Pulse Generation at Gigahertz Rates by Direct Modulation of a Semiconductor Laser; Appl. Phys. Lett. 38, p. 308; 1981.
J.E. Ripper et al.; Internal Q Switching in GaAs Junction Laser; Appl. Phys. Lett. 12, p. 365; 1968.
P. Vasilev; Ultra Diode Lasers; Artech House, Inc.; 1995.

* cited by examiner

*Primary Examiner* — Yuanda Zhang
*Assistant Examiner* — Tuan Nguyen
(74) *Attorney, Agent, or Firm* — SNR Denton US LLP

(57) ABSTRACT

An ultrashort pulse/ultra-high power laser diode with a simple structure and configuration is provided. In a method of driving a laser diode, the laser diode is driven by a pulse current which is 10 or more times higher than a threshold current value. The width of the pulse current is preferably 10 nanoseconds or less, and the value of the pulse current is specifically 0.4 amperes or over.

7 Claims, 10 Drawing Sheets $V_2 = 23V$ 350    400    450    $\lambda$ [nm]

FWHM
x: 1.04mm
y: 1.14mm $V_2 = 23V$ 350    400    450    $\lambda$ [nm]

METHOD OF DRIVING A LASER DIODE

RELATED APPLICATION DATA

This application is a continuation of U.S. patent application Ser. No. 12/506,713, filed Jul. 21, 2009, the entirety of which is incorporated herein by reference to the extent permitted by law. The present application claims the benefit of priority to Japanese Patent Application No. JP 2008-194373 filed in the Japan Patent Office on Jul. 29, 2008, the entirety of which is incorporated by reference herein to the extent permitted by law.

BACKGROUND OF THE INVENTION

The present invention relates to a method of driving a laser diode. Recently, for researches in a leading-edge science region using laser light with a pulse duration in the attosecond range or the femtosecond range, ultrashort pulse/ultra-high power lasers have been frequently used. As the ultrashort pulse/ultra-high power laser, for example, a titanium/sapphire laser is known. However, the titanium/sapphire laser is an expensive and large solid laser light source, which is a main impediment to the spread of technology. If the ultrashort pulse/ultra-high power laser is realized through the use of a laser diode, a large reduction in size and price of the ultrashort pulse/ultra-high power laser and high stability of the ultrashort pulse/ultra-high power laser are achieved.

On the other hand, in the communications field, a reduction in pulse widths of laser diodes has been actively studied since 1960's. As a method of generating a short pulse in a laser diode, a gain switching method, a loss switching method (a Q-switching method) and a mode locking method are known, and in these method, a laser diode is combined with a semiconductor amplifier, a nonlinear optical element, an optical fiber or the like to obtain higher power.

SUMMARY OF THE INVENTION

In the gain switching method which is the easiest method among the above-described methods, when a laser diode is driven by a short pulse current, a light pulse with a pulse width of approximately 20 picoseconds to 100 picoseconds is generated as described in J. Ohya et al., Appl. Phys. Lett. 56 (1990) 56., J. AuYeung et al., Appl. Phys. Lett. 38 (1981) 308., N. Yamada et al., Appl. Phys. Lett. 63 (1993) 583., J. E. Ripper et al., Appl. Phys. Lett. 12 (1968) 365., and "Ultrafast diode lasers", P. Vasil'ev, Artech House Inc., 1995. In the gain switching method, it is only necessary to drive a commercially available laser diode by a short pulse current, so a short-pulse light source with a pulse duration in the picosecond range is achieved with an extremely simple device configuration. However, the peak power of a light pulse is approximately 0.1 watts to 1 watt in an 850-nm-wavelength AlGaAs-based laser diode, and approximately 10 milliwatts to 100 milliwatts in a 1.5-μm-wavelength InGaAsP-based laser diode. Therefore, for example, as a light source needing high peak power used for two-photon absorption, the light powers of the above laser diodes are not sufficient. To increase the peak power, a complicated and difficult configuration formed by a combination of the mode locking method and a semiconductor amplifier or an optical fiber amplifier is necessary.

Thus, there have been few reported examples of a laser diode apparatus aiming at higher power on the basis of "an all-semiconductor structure" which is an essential condition for a ultimate reduction in size, that is, a laser diode apparatus configured of only a laser diode or only a combination of a laser diode and a semiconductor device, specifically a laser diode apparatus configured of a 405-nm-wavelength laser diode which is made of a GaN-based compound semiconductor. Therefore, when an "all-semiconductor" pulse laser having a high peak power at a wavelength of 405 nm is achieved, the pulse laser may be used as a light source of a volumetric optical disk system which is expected as a next-generation optical disk system following a Blu-ray optical disk system, and a convenient ultrashort pulse/ultra-high power light source covering the entire wavelength band of a visible light range may be achieved by the pulse laser, thereby a light source necessary in the medical field, the bio imaging field or the like may be provided.

It is desirable to provide and a method of driving an ultrashort pulse/ultra-high power laser diode with a simple structure and configuration.

According to a first embodiment of the invention, there is provided a method of driving a laser diode, the laser diode being driven by a pulse current which is 10 or more times, preferably 20 or more times, more preferably 50 or more times higher than a threshold current value $I_{th}$.

In this case, the threshold current value $I_{th}$ indicates a current flowing through a laser diode when laser oscillation starts, and an after-mentioned threshold voltage value $V_{th}$ indicates a voltage applied to the laser diode at this time, and a relationship of $V_{th}=R\times I_{th}+V_0$ is established where the internal resistance of the laser diode is R ($\Omega$). In this case, $V_0$ is a built-in potential of a p-n junction.

According to a second embodiment of the invention, there is provided a method of driving a laser diode, the laser diode being driven by a pulse voltage which is 2 or more times, preferably 4 or more times, more preferably 10 or more times higher than the threshold voltage value $V_{th}$.

In the method of driving a laser diode according to the first embodiment of the invention (hereinafter referred to as "the first embodiment of the invention" in some cases), a mode in which the width of the pulse current is 10 nanoseconds or less, preferably 2 nanoseconds or less may be applied. Moreover, in the first embodiment of the invention including such a preferable mode, a mode in which the value of the pulse current is 0.4 amperes or over, preferably 0.8 amperes or over may be applied. Alternatively, a mode in which the value of the pulse current is $3.5\times10^4$ ampere/cm$^2$ or over, preferably $7\times10^4$ ampere/cm$^2$ or over in terms of the value of the pulse current per cm$^2$ of the active layer (per cm$^2$ of a junction region area), that is, in terms of current density (which is operation current density in ampere/cm$^2$) may be applied. The lower limit of the width of the pulse current depends on specifications of the pulse generator, or the like. The upper limit of the value of the pulse current may be determined on the basis of the specifications of a used laser diode.

In the method of driving a laser diode according to the second embodiment of the invention (hereinafter referred to as "the second embodiment of the invention" in some cases), a mode in which the width of the pulse voltage is 10 nanoseconds or less, preferably 2 nanoseconds or less may be applied. Moreover, in the second embodiment of the invention including such a preferable mode, a mode in which the value of the pulse voltage is 8 volts or over, preferably 16 volts or over may be applied. The lower limit of the width of the pulse voltage depends on the specifications of the pulse generator, or the like. The upper limit of the value of the pulse voltage may be determined on the basis of the specifications of a used laser diode.

In the first embodiment of the invention and the second embodiment of the invention which includes various preferable modes described above (hereinafter simply collectively referred to as "the invention" in some cases), a mode in which the laser diode is a laser diode having a ridge stripe type separated confinement heterostructure (an SCH structure) may be applied. A ridge section is formed by removing a part of an after-mentioned second compound semiconductor layer in a thickness direction by, for example, an RIE method.

In the invention including the above-described preferable mode, the laser diode may include a laminate structure body including a first compound semiconductor layer, an active layer having a quantum well structure and the second compound semiconductor layer, a first electrode electrically connected to the first compound semiconductor layer, and a second electrode electrically connected to the second compound semiconductor layer, and the laminate structure body may be made of an AlGaInN-based compound semiconductor, that is, the laser diode may be a GaN-based laser diode.

In this case, specific examples of the AlGaInN-based compound semiconductor may include GaN, AlGaN, GaInN and AlGaInN. Moreover, if necessary, a boron (B) atom, a thallium (Tl) atom, an arsenic (As) atom, a phosphorus (P) atom or an antimony (Sb) atom may be included in these compound semiconductors. Further, the active layer having the quantum well structure has a structure in which at least one well layer and at least one barrier layer are laminated, and examples of a combination of (a compound semiconductor forming the well layer, a compound semiconductor forming the barrier layer) may include ($In_yGa_{(1-y)}N$, GaN), ($In_yGa_{(1-y)}N$, $In_zGa_{(1-z)}N$) [y>z], and ($In_yGa_{(1-y)}N$, AlGaN). Hereinafter the AlGaInN-based compound semiconductor forming the laminate structure body of the laser diode is referred to as "the GaN-based compound semiconductor" in some cases, and the AlGaInN-based compound semiconductor layer is referred to as "the GaN-based compound semiconductor layer" in some cases.

In the above-described preferable structure, the second compound semiconductor layer may have a superlattice structure in which p-type GaN layers and p-type AlGaN layers are alternately laminated, and the thickness of the superlattice structure is 0.7 μm or less. When such a superlattice structure is applied, while keeping a high refractive index necessary as a cladding layer, a series resistance component R of the laser diode may be reduced to cause a reduction in operation voltage of the laser diode. The lower limit of the thickness of the superlattice structure may be, for example, but not exclusively, 0.3 μm, and the thickness of the p-type GaN layer forming the superlattice structure may be, for example, within a range from 1 nm to 5 nm both inclusive, and the thickness of the p-type AlGaN layer forming the superlattice structure may be, for example, within a range from 1 nm to 5 nm both inclusive, and the total layer number of the p-type GaN layers and the p-type AlGaN layers may be for example, within a range from 60 layers to 300 layers both inclusive. Moreover, the second electrode may be arranged on the second compound semiconductor layer, and a distance from the active layer to the second electrode may be 1 μm or less, preferably 0.6 μm or less. When the distance from the active layer to the second electrode is determined in such a manner, the thickness of the p-type second compound semiconductor layer with high resistance may be reduced, and a reduction in operation voltage of the laser diode may be achieved. In addition, the lower limit of the distance from the active layer to the second electrode may be, for example, but not exclusively, 0.3 μm. Moreover, the second compound semiconductor layer may be doped with $1\times10^{19}$ $cm^{-3}$ or over of Mg, and the absorption coefficient of the second compound semiconductor layer for light with a wavelength of 405 nm may be at least 50 $cm^{-1}$. The atomic concentration of Mg is derived from such a material property that the maximum hole concentration is displayed when the atomic concentration of Mg is $2\times10^{19}$ $cm^{-3}$, and the atomic concentration of Mg is a result by designing the maximum hole concentration, that is, the specific resistance of the second compound semiconductor layer to be minimized. The absorption coefficient of the second compound semiconductor layer is determined only to minimize the resistance of the laser diode device, and as a result, the absorption coefficient of light into the active layer is typically 50 $cm^{-1}$. However, to increase the absorption coefficient, the Mg doping amount may be intentionally set to be a concentration of $2\times10^{19}$ $cm^{-3}$ or over. In this case, the upper limit of the Mg doping amount under the condition that a practical hole concentration is obtained is, for example, $8\times10^{19}$ $cm^{-3}$. Moreover, the second compound semiconductor layer may include an undoped compound semiconductor layer and a p-type compound semiconductor layer in order from the active layer side, and a distance from the active layer to the p-type compound semiconductor layer may be $1.2\times10^{-7}$ m or less. When the distance from the active layer to the p-type compound semiconductor layer is determined in such a manner, internal loss may be reduced without reducing internal quantum efficiency, thereby a threshold current density at which laser oscillation starts may be reduced. The lower limit of the distance from the active layer to the p-type compound semiconductor layer may be, for example, but not exclusively, $5\times10^{-8}$ m. Further, the laser diode may have a ridge stripe structure, and the width of a ridge section in the ridge stripe structure may be 2 μm or less, and a laminated insulating film made of an $SiO_2$/Si laminate structure may be formed on both sides of the ridge section, and a difference between the effective refractive index of the ridge section and the effective refractive index of the laminated insulating film may be within a range from $5\times10^{-3}$ to $1\times10^{-2}$ both inclusive. When such a laminated insulating film is used, even if high power operation exceeding 100 mW is performed, a single fundamental transverse mode may be maintained. The lower limit of the width of the ridge section may be, for example, but not exclusively, 0.8 μm. Further, the second compound semiconductor layer may be formed, for example, by laminating an undoped GaInN layer (a p-side light guide layer), an undoped AlGaN layer (a p-side cladding layer), a Mg-doped AlGaN layer (an electronic barrier layer), a GaN layer (doped with Mg)/AlGaN layer superlattice structure (a superlattice cladding layer) and a Mg-doped GaN layer (a p-side contact layer) in order from the active layer side. Further, the beam emission half angle $\theta\perp$ in a perpendicular direction of laser light emitted from an end surface of the laser diode may be 25 degrees or less, preferably 21 degrees or less. The lower limit of the beam emission half angle $\theta\perp$ may be, for example, but not exclusively 17 degrees. The resonant length may be, for example, within a range from 0 3 mm to 2 mm both inclusive. The band gap of a compound semiconductor forming the well layer in the active layer is desired to be 2.4 eV or over. Moreover, the wavelength of laser light emitted from the active layer is desired to be within a range from 360 nm to 500 nm both inclusive, preferably within a range from 400 nm to 410 nm both inclusive. The above-described various configurations may be combined as necessary.

In the invention, various GaN-based compound semiconductor layers forming the laser diode are formed in order on a substrate. In this case, as the substrate, in addition to a sapphire substrate, a GaAs substrate, a GaN substrate, a SiC substrate, an alumina substrate, a ZnS substrate, a ZnO substrate, an MN substrate, a LiMgO substrate, a $LiGaO_2$ substrate, a $MgAl_2O_4$ substrate, an InP substrate, a Si substrate or a substrate formed by forming a base layer or a buffer layer on a surface (main surface) of any one of these substrates may be used. Moreover, as a method of forming various GaN-based compound semiconductor layers forming the laser diode, a metal organic chemical vapor deposition method (an MOCVD method, an MOVPE method), a molecular beam epitaxy method (an MBE method), a hydride vapor phase epitaxy method in which a halogen contributes transport or reaction, or the like may be used.

In this case, as an organic gallium source gas in the MOCVD method, trimethyl gallium (TMG) gas or a triethyl gallium (TEG) gas may be used, and as a nitrogen source gas, an ammonia gas or a hydrazine gas may be used. When a GaN-based compound semiconductor layer having n-type conduction is formed, for example, as an n-type impurity (an n-type dopant), silicon (Si) may be added, and when a GaN-based compound semiconductor layer having p-type conduction is formed, for example, as a p-type impurity (a p-type dopant), magnesium (Mg) may be added. Moreover, in the case where aluminum (Al) or indium (In) is included as a constituent atom of the GaN-based compound semiconductor layer, a trimethyl aluminum (TMA) gas may be used as an Al source, and a trimethyl indium (TMI) gas may be used as an In source. Further, as a Si source, a monosilane gas (a $SiH_4$ gas) may be used, and as an Mg source, a cyclopentadienyl magnesium gas, methylcyclopentadienyl magnesium or bis-cyclopentadienyl magnesium ($Cp_2Mg$) may be used. In addition, as the n-type impurity (the n-type dopant), in addition to Si, Ge, Se, Sn, C, Te, S, O, Pd or Po may be used, and as the p-type impurity (the p-type dopant), in addition to Mg, Zn, Cd, Be, Ca, Ba, C, Hg or Sr may be used.

The second electrode electrically connected to the second compound semiconductor layer having p-type conduction (or the second electrode formed on the contact layer) preferably has a single-layer configuration or a multilayer configuration including at least one kind of metal selected from the group consisting of palladium (Pd), platinum (Pt), nickel (Ni), aluminum (Al), titanium (Ti), gold (Au) and silver (Ag). Alternatively, a transparent conductive material such as ITO (Indium tin oxide) may be used. On the other hand, the first electrode electrically connected to the first compound semiconductor layer having n-type conduction preferably has a single-layer configuration or a multilayer configuration including at least one kind of metal selected from the group consisting of gold (Au), silver (Ag), palladium (Pd), aluminum (Al), titanium (Ti), tungsten (W), copper (Cu), zinc (Zn), tin (Sn) and indium (In), and, for example, Ti/Au, Ti/Al, or Ti/Pt/Au may be used. The first electrode or the second electrode may be formed by, for example, a PVD method such as a vacuum deposition method or a sputtering method. The first electrode is electrically connected to the first compound semiconductor layer, and a mode in which the first electrode is formed on the first compound semiconductor layer, and a mode in which the first electrode is connected to the first compound semiconductor layer with a conductive material layer or a conductive substrate in between are included. In a like manner, the second electrode is electrically connected to the second compound semiconductor layer, and a mode in which the second electrode is formed on the second compound semiconductor layer, and a mode in which the second electrode is connected to the second compound semiconductor layer with a conductive material layer in between are included.

A pad electrode may be arranged on the first electrode or the second electrode to be electrically connected to an external electrode or a circuit. The pad electrode preferably has a single-layer configuration or a multilayer configuration including at least one kind of metal selected from the group consisting of titanium (Ti), aluminum (Al), platinum (Pt), gold (Au) and nickel (Ni). Alternatively, the pad electrode may have, for example, a multilayer configuration such as a Ti/Pt/Au multilayer configuration or a Ti/Au multilayer configuration.

The invention is applicable to, for example, fields such as optical disk systems, the communications field, the optical information field, opto-electronic integrated circuits, fields of application of nonlinear optical phenomena, optical switches, various analysis fields such as the laser measurement field, the ultrafast spectroscopy field, the multiphase excitation spectroscopy field, the mass analysis field, the microspectroscopy field using multiphoton absorption, quantum control of chemical reaction, the nano three-dimensional processing field, various processing fields using multiphoton absorption, the medical fields and the bio imaging field.

In the first embodiment of the invention, the laser diode is driven by a pulse current which is 10 or more times higher than the threshold current value $I_{th}$, and in the second embodiment of the invention, the laser diode is driven by a pulse voltage which is 2 or more times higher than the threshold voltage value $V_{th}$. As a result, an ultrashort pulse/ultra-high power laser diode emitting laser light having a light intensity of 3 watts or over and a pointed peak with a half-value width of 20 picoseconds or less is provided.

Other and further objects, features and advantages of the invention will appear more fully from the following description.

DETAILED DESCRIPTION OF THE PREFERRED EMBODIMENTS

Preferred embodiments will be described in detail below referring to the accompanying drawings.

Example 1

Example 1 relates to methods of driving a laser diode according to a first embodiment and a second embodiment of the invention.

Figure 1A:
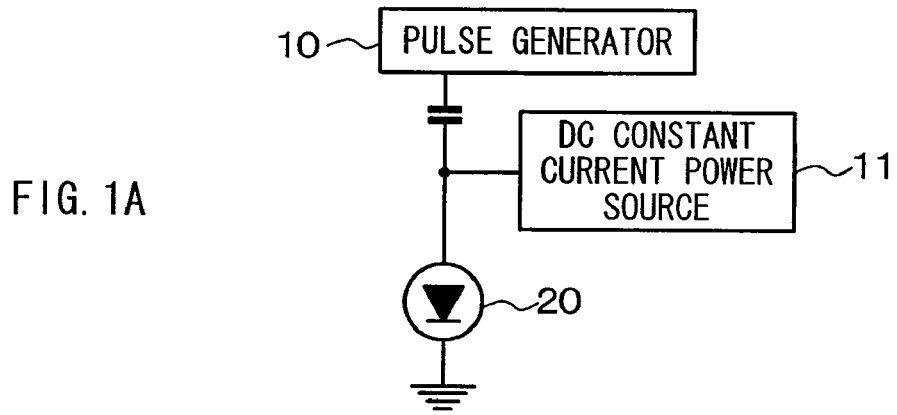
FIGS. 1A and 1B are circuit diagrams of a laser diode apparatus of Example 1.
Figure 1B:
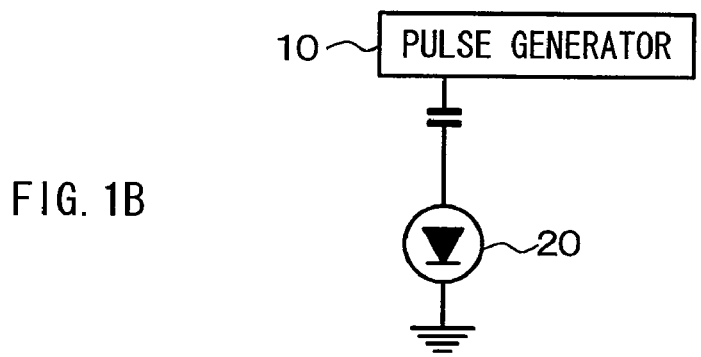

As illustrated in FIG. 1A, a laser diode apparatus including an ultrashort pulse/ultra-high power laser diode of Example 1 includes a pulse generator 10 and a laser diode 20 driven by a driving pulse from the pulse generator 10. More specifically, the laser diode apparatus includes the GaN-based laser diode 20 with an emission wavelength of 405 nm and the high-power pulse generator 10 allowing the GaN-based laser diode 20 to perform gain switching operation. In addition, the laser diode apparatus includes a DC constant current power source 11, but as illustrated in FIG. 1B, the DC constant current power source 11 is not necessarily included. In this case, the DC constant current power source 11 has a known circuit configuration, and the pulse generator 10 may have a configuration in which a low-voltage pulse generator and a high-power voltage amplifier are combined together.

Figure 1C:
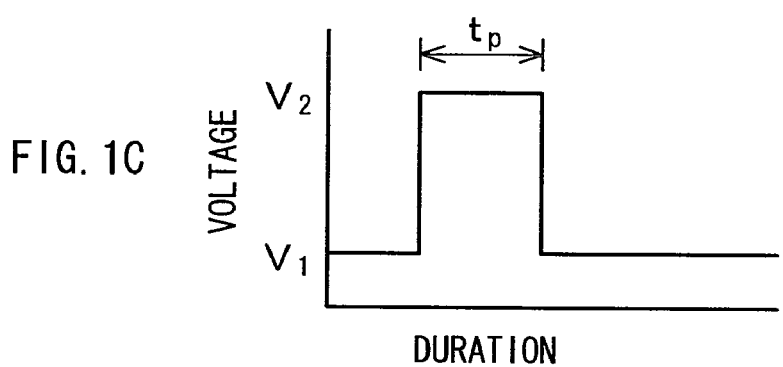
FIGS. 1C and 1D are schematic views of a rectangular pulse voltage applied to a laser diode.
Figure 1D:
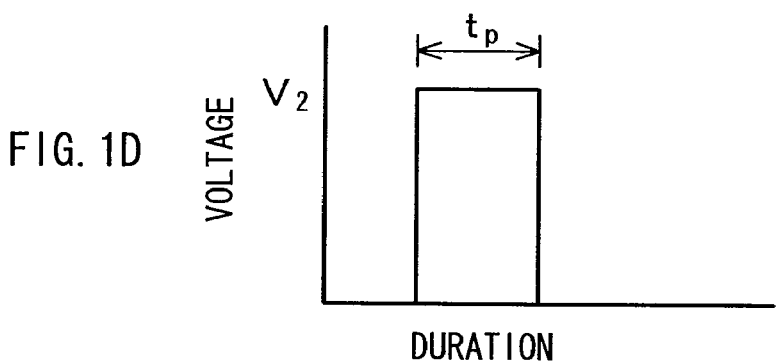

As illustrated in FIG. 1C, a voltage (a driving pulse) applied to the laser diode 20 is a rectangular pulse voltage $V_2$ with a duration $t_p$. In addition, the DC constant current power source 11 is included, so the voltage applied to the laser diode 20 is a voltage obtained by adding the rectangular pulse voltage $V_2$ with the duration $t_p$ to a DC voltage $V_1$. In this case, the DC voltage $V_1$ is $V_1 = R \times I_1 + V_0 \approx V_0 = 3$ volts which is determined from a current (value: $I_1$) supplied from the DC constant current power source 11, internal resistance R of the laser diode 20 and a built-in potential $V_0$ of a p-n junction. However, wiring resistance, contact resistance between wiring and the laser diode 20, or the like is not considered in this case. In the circuit configuration illustrated in FIG. 1B, as illustrated in FIG. 1D, a voltage applied to the laser diode 20 is a rectangular pulse voltage $V_2$ with the duration $t_p$.

The laser diode 20 is a laser diode having a ridge stripe type separated confinement heterostructure (SCH structure). More specifically, the laser diode 20 is a GaN-based laser diode made of index guide type AlGaInN developed for a Blu-ray optical disk system, and has a ridge stripe structure. As specifications of the laser diode 20, the absolute maximum rated light power is 85 milliwatts during continuous driving and 170 milliwatts during pulse driving (a pulse width of 7.5 nanoseconds and a duty ratio of 50%). Moreover, the standard value of an emission wavelength is 405 nm, a threshold current value $I_{th}$ (the standard value of a oscillation start current) is 40 milliamperes, and the standard values of an emission angle parallel to an active layer (a beam emission half angle θ// in a horizontal direction) of laser light emitted from an end surface of the laser diode 20 and an emission angle perpendicular to the active layer (a beam emission half angle θ⊥) of the laser light are 8 degrees and 21 degrees, respectively. The laser diode 20 is a high-power laser diode in which light confinement in a direction (a vertical direction) where compound semiconductor layers which will be described later are laminated is weakened. Further, the resonant length is 0.8 mm.

Figure 2:
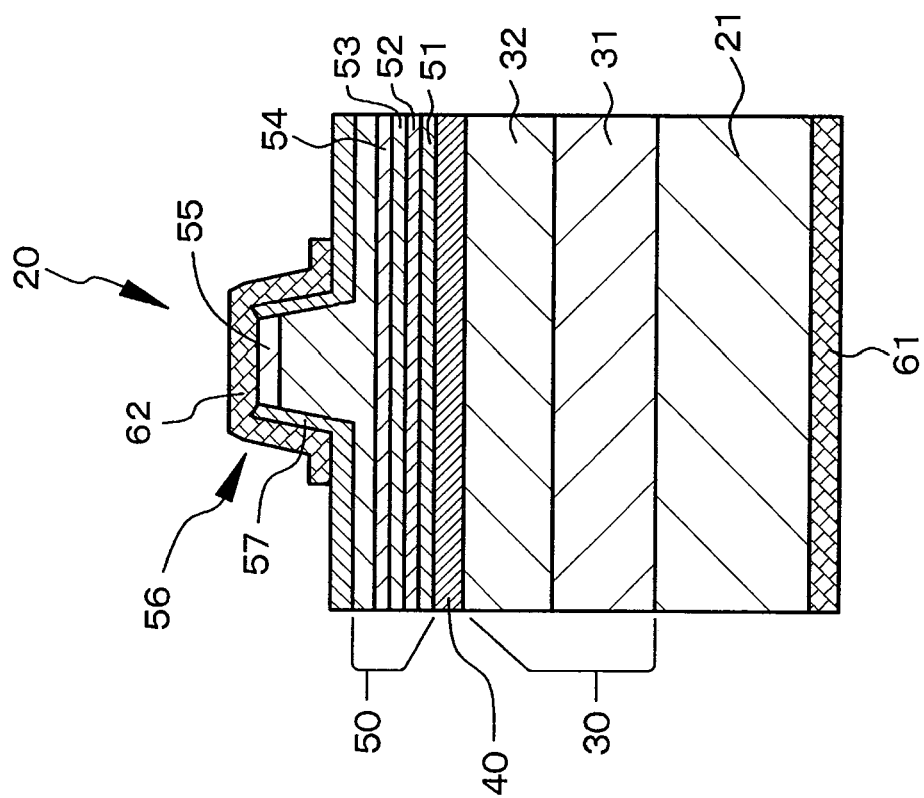
FIG. 2 is a schematic sectional view of a laser diode of Example 1.

A schematic sectional view of the laser diode 20 is illustrated in FIG. 2. The laser diode 20 is arranged on a (0001) plane of an n-type GaN substrate 21, and includes a laminate structure body including a first compound semiconductor layer 30, an active layer 40 having a quantum well structure and a second compound semiconductor layer 50, a first electrode 61 electrically connected to the first compound semiconductor layer 30 and a second electrode 62 electrically connected to the second compound semiconductor layer 50. The first compound semiconductor layer 30, the active layer 40 and the second compound semiconductor layer 50 are made of a GaN-based compound semiconductor, specifically, an AlGaInN-based compound semiconductor. More specifically, the laser diode 20 has a layer structure indicated by the following Table 1. In this case, compound semiconductor layers in Table 1 are listed in order of decreasing distance from the n-type GaN substrate 21. In addition, the band gap of a compound semiconductor forming a well layer in the active layer 40 is 3.06 eV.

TABLE 1

Second compound semiconductor layer 50
P-type GaN contact layer (Mg doped) 55
P-type GaN (Mg doped)/AlGaN superlattice cladding layer 54
P-type AlGaN electronic barrier layer (Mg doped) 53
Undoped AlGaN cladding layer 52
Undoped GaInN light guide layer 51
Active layer 40
GaInN quantum well active layer
(Well layer: $Ga_{0.92}In_{0.08}N$/barrier layer: $Ga_{0.98}In_{0.02}N$)
First compound semiconductor layer 30
N-type GaN cladding layer 32
N-type AlGaN cladding layer 31

Moreover, a part of the p-type GaN contact layer 55 and a part of the p-type GaN/AlGaN superlattice cladding layer 54 are removed by an RIE method to form a ridge section 56 with a width of 1.4 μm. A laminated insulating film 57 made of $SiO_2$/Si is formed on both sides of the ridge section 56. The $SiO_2$ layer is a lower layer, and the Si layer is an upper layer. In this case, a difference between the effective refractive index of the ridge section 56 and the effective refractive index of the laminated insulating film 57 is within a range from $5 \times 10^{-3}$ to $1 \times 10^{-2}$ both inclusive, more specifically $7 \times 10^{-3}$. The second electrode (a p-type ohmic electrode) 62 made of Pd/Pt/Au is formed on the p-type GaN contact layer 55 corresponding to a top surface of the ridge section 56. On the other hand, the first electrode (an n-type ohmic electrode 61) made of Ti/Pt/Au is formed on a back surface of the n-type GaN substrate 21.

The thickness of the p-type GaN/AlGaN superlattice cladding layer 54 having a superlattice structure in which p-type GaN layers and p-type AlGaN layer are alternately laminated is 0.7 μm or less, specifically 0.4 μm, and the thickness of each p-type GaN layer constituting the superlattice structure is 2.5 nm, and the thickness of each p-type AlGaN layer constituting the superlattice structure is 2.5 nm, and the total number of the p-type GaN layers and the p-type AlGaN layers is 160 layers. A distance from the active layer 40 to the second electrode 62 is 1 μm or less, specifically 0.6 μm. Moreover, the p-type AlGaN electronic barrier layer 53, the p-type GaN/AlGaN superlattice cladding layer 54 and the p-type GaN contact layer 55 constituting the second compound semiconductor layer 50 are doped with $1 \times 10^{19}$ $cm^{-3}$ or over (specifically $2 \times 10^{19}$ $cm^{-3}$) of Mg, and the absorption coefficient of the second compound semiconductor layer 50 for light with a wavelength of 405 nm is at least 50 $cm^{-1}$, specifically 65 cm. Further, the second compound semiconductor layer 50 includes an undoped compound semiconductor layer (the undoped GaInN light guide layer 51 and the undoped AlGaN cladding layer 52) and a p-type compound semiconductor layer in order from the active layer side, and a distance d from the active layer to the p-type compound semiconductor layer (specifically the p-type AlGaN electronic barrier layer 53) is $1.2 \times 10^{-7}$ m or less, specifically 100 nm.

Figure 3:
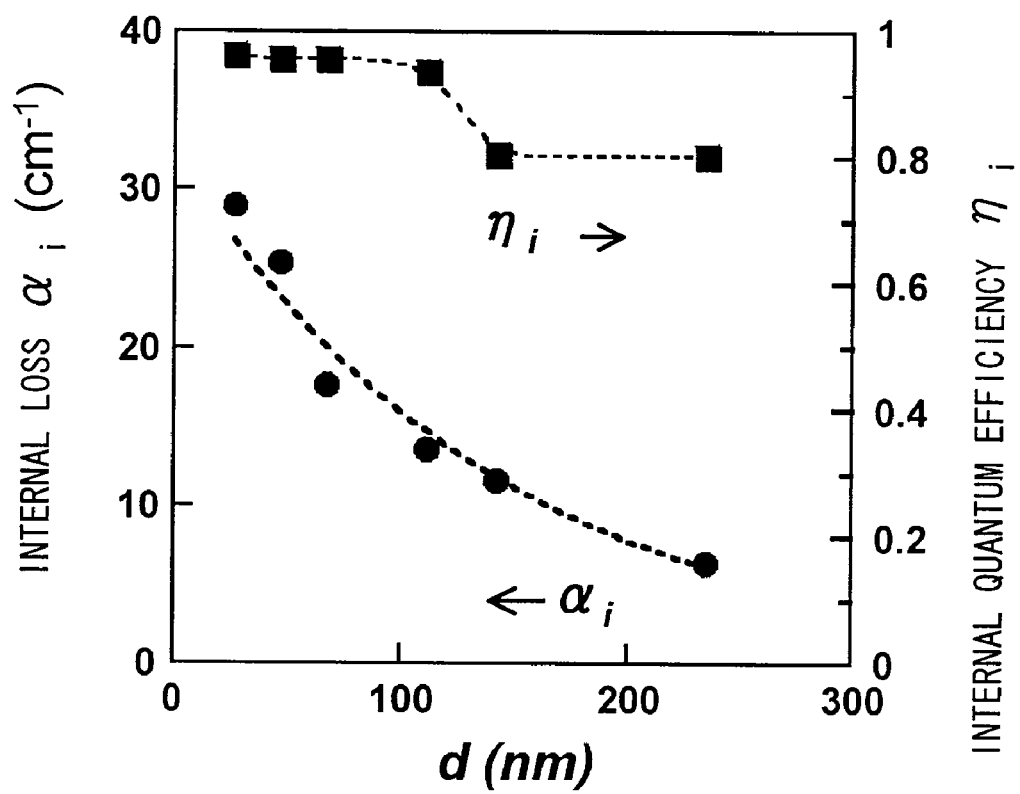
FIG. 3 is a graph illustrating results of internal loss and internal quantum efficiency of laser diodes with different distances d from an active layer to a p-type AlGaN electronic barrier layer in the laser diode of Example 1.

In the laser diode 20 of Example 1, the p-type AlGaN electronic barrier layer 53, the p-type GaN/AlGaN superlattice cladding layer 54 and the p-type GaN contact layer 55, which are Mg-doped compound semiconductor layers, overlap a light density distribution generated from the active layer 40 and its surroundings as little as possible, thereby internal loss is reduced without reducing internal quantum efficiency. As a result, a threshold current density at which laser oscillation starts is reduced. FIG. 3 illustrates results of internal loss $\alpha_i$ and internal quantum efficiency $\eta_i$ determined by actually forming laser diodes with different distances d from the active layer 40 to the p-type AlGaN electronic barrier layer 53. It was obvious from FIG. 3 that when the value of d increased, the internal loss $\alpha$ declined, but when the value of d reached a certain value or higher, hole injection efficiency into the well layer declined, thereby electron-hole recombination efficiency in the active layer declined, and the internal quantum efficiency $\eta_i$ declined. The value of d was designed as described above on the basis of the above results.

In a method of driving the laser diode of Example 1, the laser diode is driven by a pulse current which is 10 or more times, preferably 20 or more times, more preferably 50 or more times higher than a threshold current value $I_{th}$. The value of the current is a value far exceeding a current value (a rated current) necessary to obtain a rated light power. Alternatively, in the method of driving the laser diode of Example 1, the laser diode is driven by a pulse voltage which is 2 or more times, preferably 4 or more times, more preferably 10 or more times higher than a threshold voltage value $V_{th}$, or the laser diode is driven by a voltage increased to a voltage inducing transverse mode instability or higher. Moreover, the laser diode 20 of Example 1 or the laser diode 20 forming a laser diode apparatus of Example 1 is driven by a pulse current which is 10 or more times, preferably 20 or more times, more preferably 50 or more times higher than the threshold current value $I_{th}$, or by a pulse current far exceeding the rated current. Alternatively, the laser diode 20 of Example 1 or the laser diode 20 forming a laser diode apparatus of Example 1 is driven by a pulse voltage which is 2 or more times, preferably 4 or more times, more preferably 10 or more times higher than the threshold voltage value $V_{th}$, or by a voltage increased to a voltage inducing transverse mode instability or higher. Alternatively, the laser diode 20 of Example 1 or the laser diode 20 forming the laser diode apparatus of Example 1 emits a first light peak and a second light peak following the first light peak. The first light peak has a light intensity of 3 watts or over, preferably 5 watts or over, more preferably 10 watts or over and a half-value width of 20 picoseconds or less, preferably 15 picoseconds or less, more preferably 10 picoseconds or less, and the second light peak has an energy of 1 nanojoule or over, preferably 2 nanojoules or over, more preferably 5 nanojoules or over and a duration of 1 nanosecond or over, preferably 2 nanoseconds or over, more preferably 5 nanoseconds or over.

When a pulsing voltage illustrated in FIG. 1C was applied, light waveforms illustrated in FIGS. 4A to 4D were observed from the laser diode 20 of Example 1 through the use of a fast photodetector and a sampling oscilloscope. In this case, the specifications of the applied pulsed voltage are as illustrated in Table 2. The vertical axis in each of FIGS. 4A to 4D indicates a signal voltage obtained from the fast photodetector, and an output signal of 500 millivolts corresponds to a light power of 10 watts.

TABLE 2

Figure 4A:
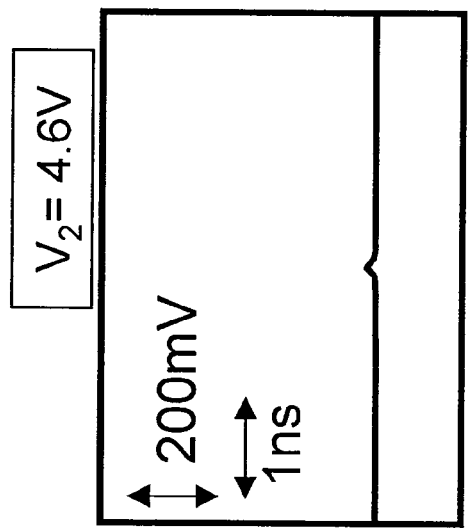
FIGS. 4A to 4D are illustrations of waveforms of laser light emitted from the laser diode of Example 1.
Figure 4B:
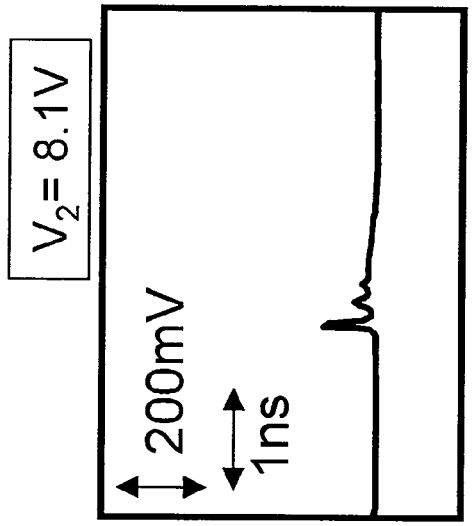
Figure 4C:
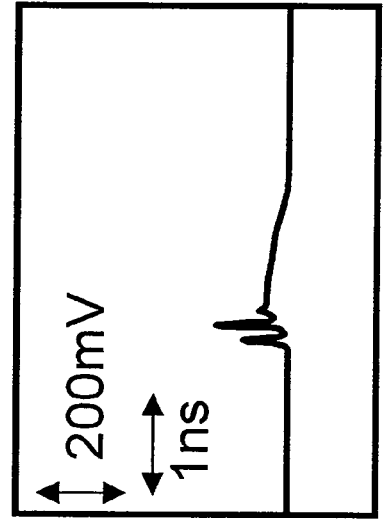

DC constant current $I_1$: 0.1 milliamperes
Pulse width $t_p$: 2 nanoseconds
Pulse recurrence frequency f: 100 kHz As illustrated in FIG. 4A, when a pulse voltage $V_2$ was 4.6 volts, a single light peak was obtained. As illustrated in FIG. 4B, when the pulse voltage $V_2$ was 8.1 volts, a plurality of light pulses caused by the relaxation oscillation of the laser diode were generated. As illustrated in FIG. 4C, when the pulse voltage $V_2$ increased, in the case where the pulse voltage $V_2$ was 14.3 volts, a plurality of sharp light pulses with a half-value width of 50 picoseconds or less were generated, and then a wide light pulse with a duration of approximately 1 nanosecond is superimposed thereon.

Figure 4D:
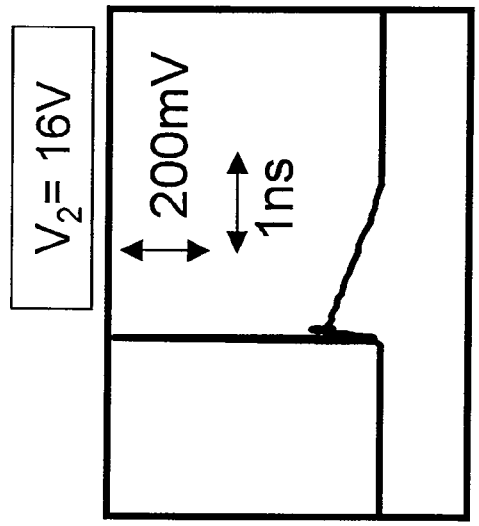
Figure 5A:
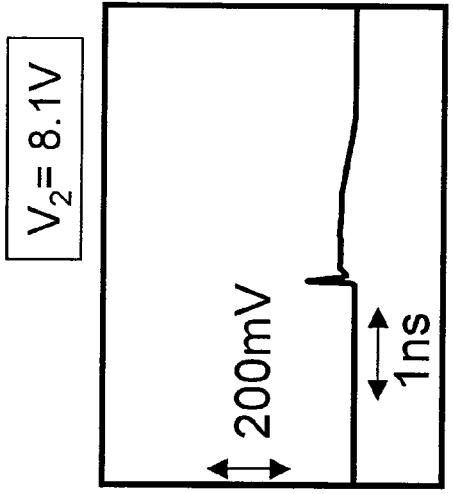
FIGS. 5A to 5D are illustrations of waveforms of laser light emitted from a GaAs-based laser diode.
Figure 5B:
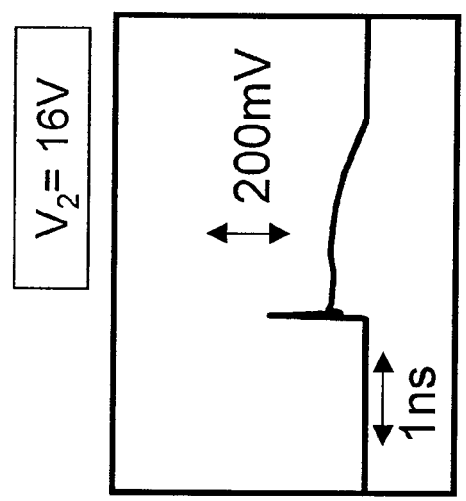
Figure 5C:
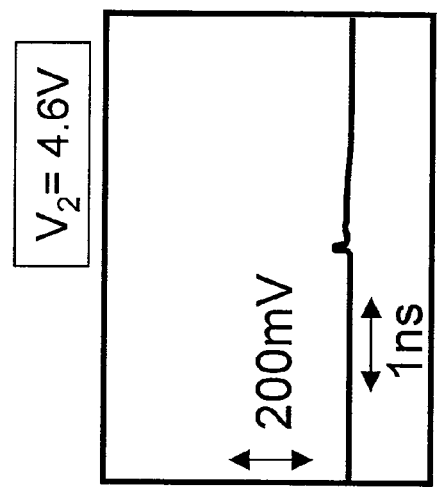
Figure 5D:
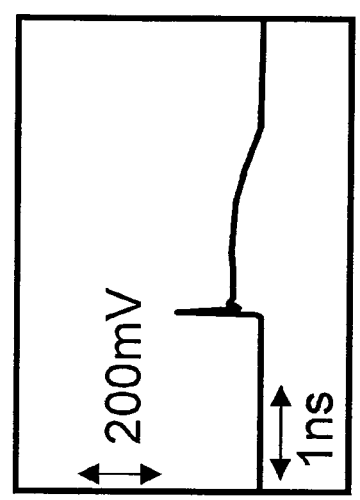

When the pulse voltage $V_2$ was 16 volts, as illustrated in FIG. 4D, a sharp single light pulse (called a giant pulse (GP), and corresponding to the first light peak) with a half-value width of 20 picoseconds or less and a high peak energy (approximately 10 watts) was generated, and after the first light peak, a plurality of light pulses with low intensity and a wide light peak with a duration of 1 nanosecond or over (which is the second light peak with a duration of approximately 1.5 nanoseconds) superimposed on each other were observed. The value of a pulse current at that time was 0.4 amperes or over, specifically 1.6 amperes, or the value of the pulse current was $1.4 \times 10^5$ ampere/cm$^2$ in terms of the value of the pulse current per cm$^2$ of the active layer (per cm$^2$ of a junction region area), that is, in terms of current density (which is operation current density in ampere/cm$^2$).

The same experiment was performed on a GaAs-based high-power laser diode. The results are illustrated in FIGS. 5A to 5D. The driving conditions were the same as those in the laser diode 20 of Example 1. When the pulse voltage $V_2$ increased, a plurality of light pulses caused by relaxation oscillation and a wide light peak with a duration of 1 nanosecond following the plurality of light pulses were observed. However, a light pulse with a high peak value such as the first light peak observed in the laser diode 20 of Example 1 was not observed. The generation of the first light peak (GP) is considered as a unique phenomenon obtained by gain switching operation performed by a GaN-based laser diode.

Figure 6:
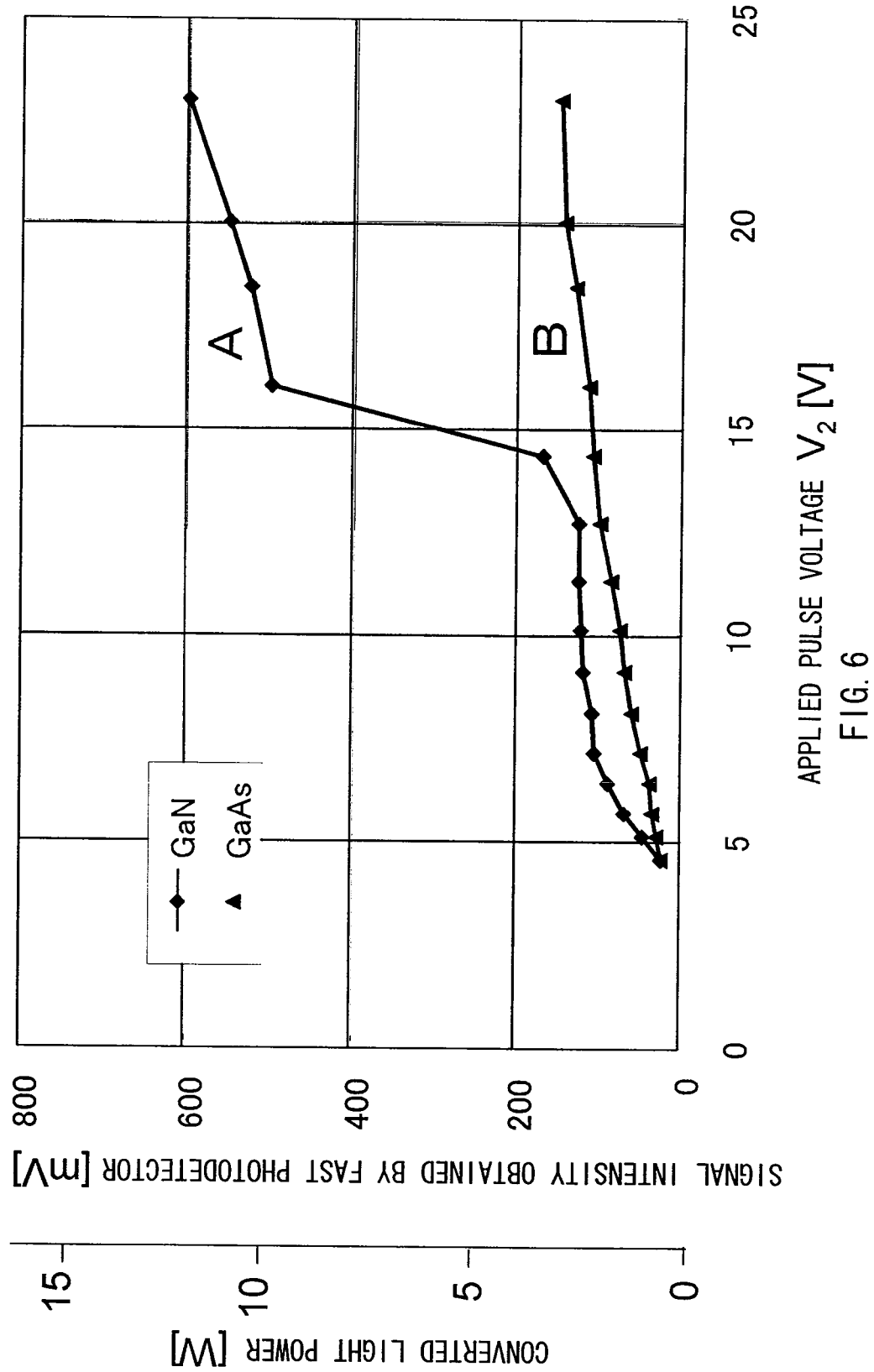
FIG. 6 is a graph illustrating peak light powers of first light peaks and pointed peaks which are obtained by changing an applied pulse voltage $V_2$ in the laser diode of Example 1 and the GaAs-based laser diode.

FIG. 6 illustrates peak light powers of the first light peak or a pointed peak obtained by changing the applied pulse voltage $V_2$. In the GaAs-based high-power laser diode, as indicated by "B", a narrow light pulse with a half-value width of 50 nanoseconds was generated, but the peak light power of the light pulse was a simple increasing function with respect to a pulse voltage. On the other hand, in the laser diode 20 of Example 1, as indicated by "A", when the pulse voltage $V_2$ exceeded 15 volts, the peak light power was pronouncedly increased to generate the first light peak (GP). In other words, the laser diode 20 of Example 1 generated a light peak power which was a few times, in some cases, one digit higher than an AlGaAs-based laser diode in related art.

Figure 7B:
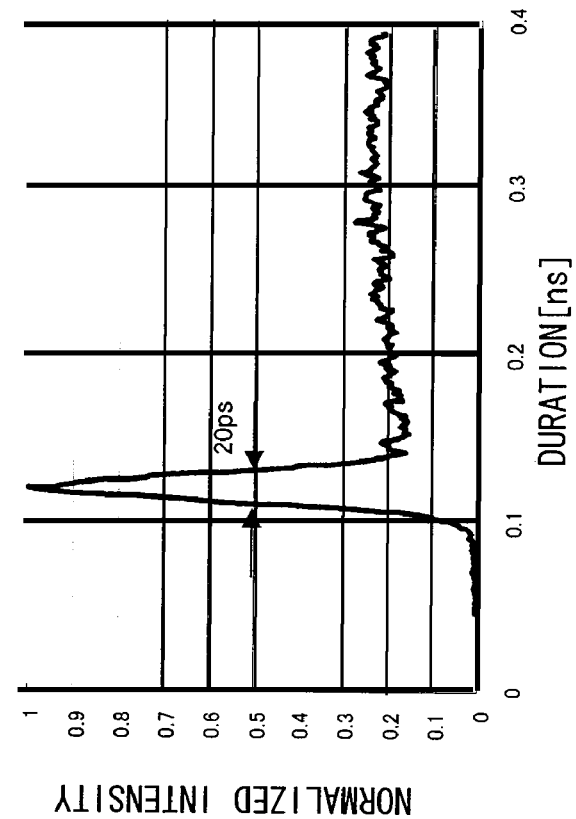
FIG. 7B is an illustration of results obtained by measuring the half-value width of the first light peak (GP) by a streak camera in the laser diode of Example 1.
Figure 7A:
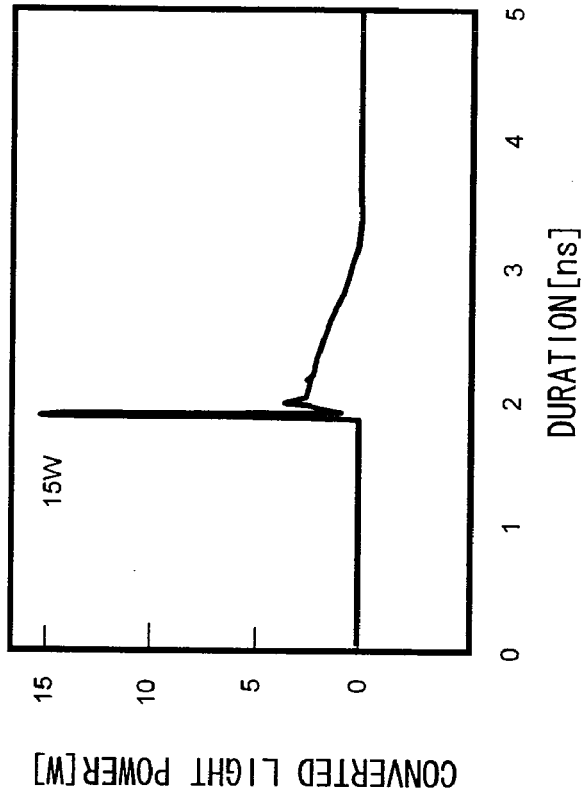
FIG. 7A is an illustration of a light waveform measured by a fast photodetector and a sampling oscilloscope and a typical example of a generated first light peak (GP) in the laser diode of Example 1.

A light waveform measured by the fast photodetector and the sampling oscilloscope and a typical example of the generated first light peak (GP) are illustrated in FIG. 7A. The first light peak (GP) with a high peak light intensity of 15 watts and the second light peak with 1 nanojoule or over, specifically 1.1 nanojoules and a duration of 1 nanosecond or over, specifically 1.5 nanoseconds following the first light peak were generated. The driving conditions at that time are as illustrated in the following Table 3. Moreover, when the half-value width of the first light peak (GP) was measured by a streak camera, the half-value width was 20 picoseconds which was very narrow (refer to FIG. 7B).

TABLE 3

Figure 8:
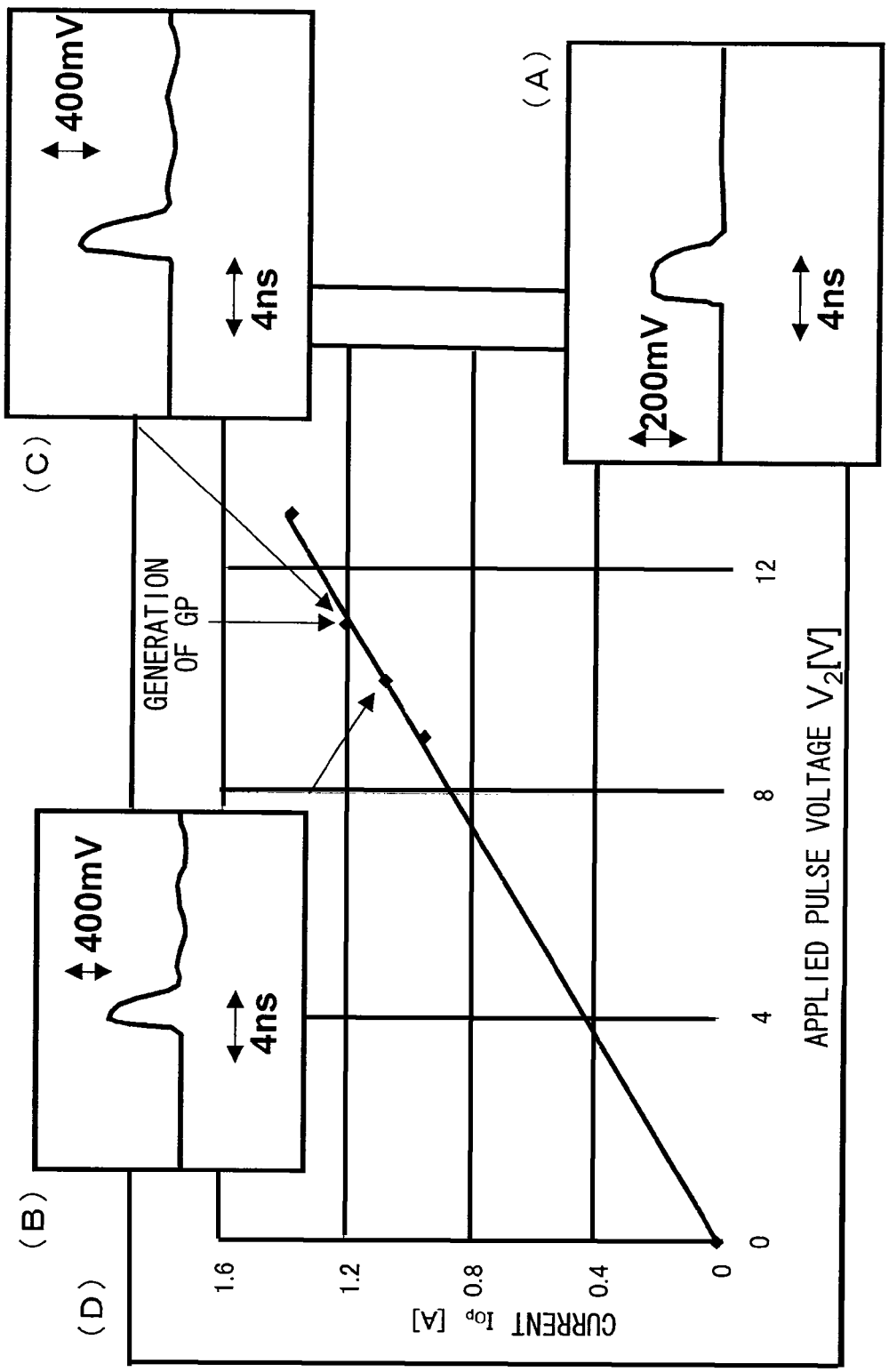
FIG. 8 illustrates a graph illustrating the waveform of an applied pulse voltage in the laser diode of Example 1 in (A), graphs illustrating waveforms of a voltage generated between both ends of a resistor of 0.5 ohms corresponding to a current monitor in (B) and (C), and a graph illustrating a relationship between a pulse voltage $V_2$ and a current $I_{op}$ flowing through a laser diode in (D).

DC constant current $I_1$: 0.1 milliamperes
Pulse width $t_p$: 2 nanoseconds
Pulse recurrence frequency f: 100 kHz
Pulse voltage $V_2$: 45 volts To consider the mechanism of the generation of the first light peak (GP), the pulse voltage $V_2$ applied to the laser diode 20 of Example 1 (a laser diode different from the laser diode used for the experiment illustrated in FIGS. 5A to 5D) and a current $I_{Op}$ flowing through the laser diode were measured before and after the generation of the first light peak (GP). The current $I_{Op}$ flowing through the laser diode was determined by inserting a resistor of 0.5 ohms into the laser diode in series and then measuring a voltage between both ends of the resistor. The applied pulse waveform was obtained by adding a pulse voltage (with a width of approximately 2 nanoseconds, the voltage $V_2$) as illustrated in FIG. 8A to a DC constant current $I_1$=0.1 milliamperes. The pulse recurrence frequency f at that time was 100 kHz. Moreover, the waveform of a voltage generated between both ends of the resistor of 0.5 ohms corresponding to a current monitor is illustrated in FIG. 8B and 8C. A relationship between the pulse voltage $V_2$ obtained in such a manner and the current $I_{Op}$ flowing through the laser diode is illustrated in FIG. 8D. In the experiment, the first light peak (GP) was generated around $V_2$=11 volts, but a current-voltage characteristic was not changed much before and after $V_2$=11 volts, and the gradient of the current-voltage characteristic was constant. Therefore, it was considered that the current $I_{Op}$ flowing through the laser diode did not cause the generation of the first light peak (GP).

Figure 9:
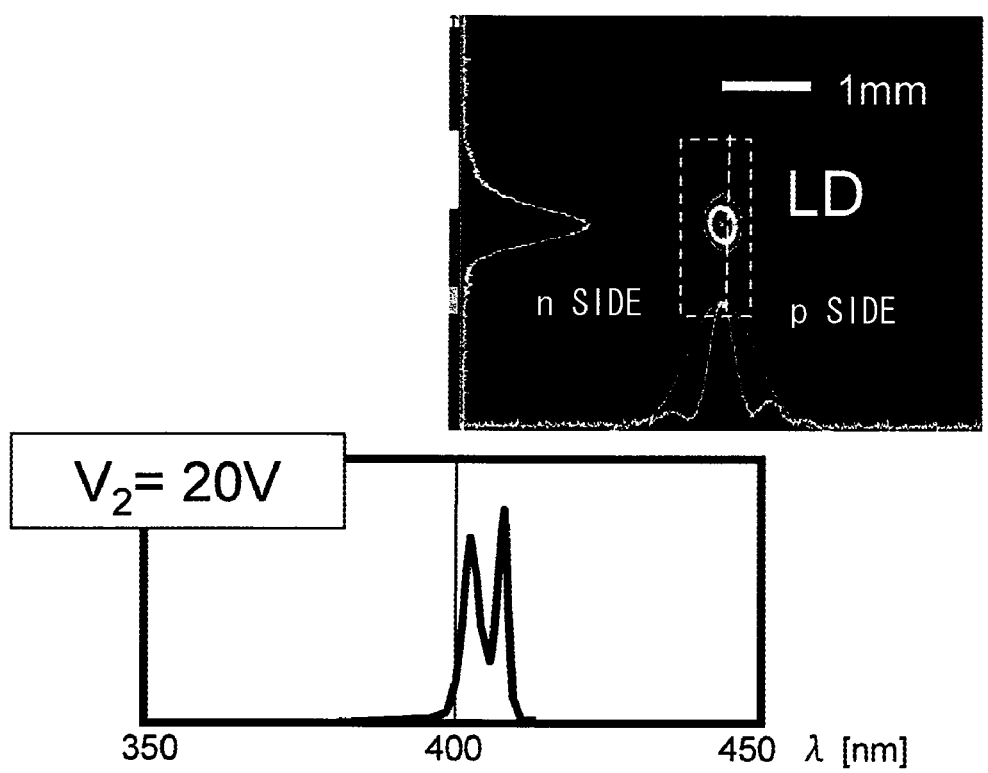
FIG. 9 is an illustration of a spectrum and an NFP before generating the first light peak (GP) in the laser diode of Example 1.
Figure 10A:
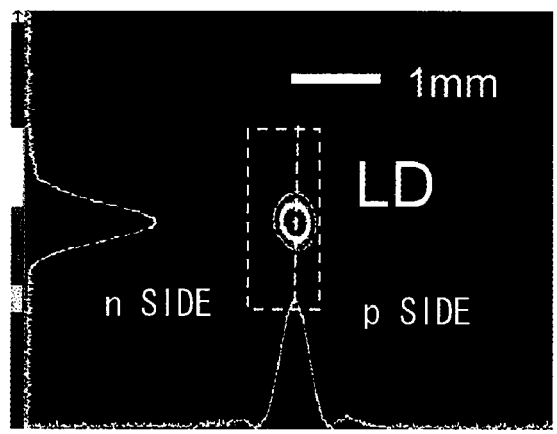
FIGS. 10A and 10B are illustrations of a spectrum and an NFP after generating the first light peak (GP) in the laser diode of Example 1.
Figure 10B:
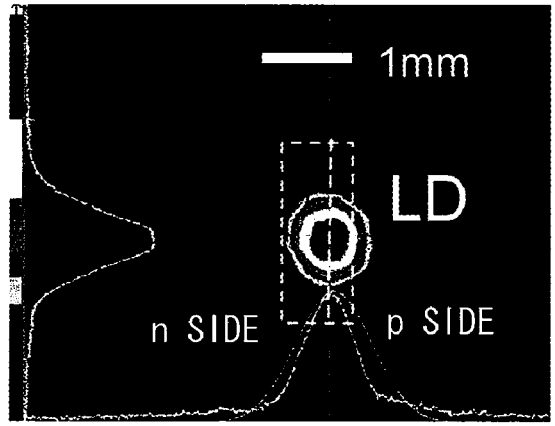

Spectrums and NFPs (Near Field Patterns) before and after the generation of the first light peak (GP) are illustrated in FIG. 9 and FIGS. 10A and 10B. The driving conditions at that time were the same as those illustrated in Table 1. In the experiment, a laser diode device different from the laser diodes used in the experiment illustrated in FIGS. 5A to 5D and 8A to 8D was used, so in the case of the pulse voltage $V_2$=20 volts, the first light peak (GP) was not generated. When the spectrum at that time was examined, as illustrated in FIG. 9, an oscillation peak at 402 nm and an oscillation peak at 407 nm on a longer wavelength side were observed. It was obvious from the NFP that in a transverse mode, in addition to a fundamental, a high-order mode component was generated at both sides of the vertical direction. When the pulse voltage was increased to the pulse voltage $V_2$=23 volts, the first light peak (GP) was generated. When the spectrum and the NFP at that time were measured, as illustrated in FIG. 10A, the above-described oscillation peak at 407 nm on the longer wavelength side was eliminated after the generation of the first light peak (GP), and an oscillation peak was generated on a shorter wavelength side around 395 nm. In FIG. 10A, the oscillation peak around 395 nm overlapped the oscillation peak at 402 nm. When the signal of the oscillation peak at 395 nm was extracted by a bandpass filter to measure the NFP, as illustrated in FIG. 10B, such a change that in the transverse mode, the fundamental with a large width in the vertical direction was broadened by the generation of the first light peak (GP) was observed.

Therefore, it was considered that the laser diode 20 of Example 1 performed such Q switching laser-like operation that the first light peak (GP) was generated by having an energy accumulation mechanism caused by instability in the transverse mode. In other words, the laser diode according to the embodiment of the invention was considered as a gain switching type laser diode including a Q switching laser-like function by having the energy accumulation mechanism caused by instability in the transverse mode. Therefore, it was considered that a short light pulse width of 20 picoseconds or less and a peak light power of 3 watts or over (for example, 10 watts or over) which were not obtained in a gain switching laser diode in related art were obtained by the Q switching mechanism effectively underlying with an increase in current pulses.

There was a slight difference in the pulse voltage $V_2$ at which the first light peak (GP) was generated between laser diodes, and when the value of the DC constant current $I_1$ increased, the value of the pulse voltage $V_2$ at which the first light peak (GP) was generated also increased. More specifically, in the case of $I_1$=0.1 milliamperes, and $I_1$=3 milliamperes, the pulse voltages $V_2$ illustrated in the following Table 4 were obtained as the value of the pulse voltage $V_2$ at which the first light peak (GP) was generated.

TABLE 4

| DC constant current $I_1$ | 0.1 mA | 3 mA |
|---|---|---|
| Laser diode-A | 19 volts | 40 volts |
| Laser diode-B | 13 volts | 26 volts |
| Laser diode-C | 10 volts | 23 volts |

As described above, in Example 1, the laser diode 20 was driven by a pulse current which was 10 or more times higher than the threshold current value $I_{th}$, or the laser diode 20 was driven by a pulse voltage which was 2 or more times higher than the threshold voltage value $V_{th}$. As a result, an ultrashort pulse/ultra-high power laser diode emitting laser light having a light intensity of 3 watts or over and a pointed peak with a half-value width of 20 picoseconds or less was obtained. Moreover, in the laser diode of Example 1, a laser diode emitting laser light having a light intensity of 3 watts or over and a pointed peak with a half-value width of 20 picoseconds or less as the first light peak (GP), and the second light peak having a high energy of 1 nanojoule or over and a high broad energy even with a duration of 1 nanosecond or over following the first light peak (GP) was obtained.

Although the present invention is described referring to the preferable example, the invention is not limited thereto. The configuration and structure of the laser diode described in the example, the configuration of the laser diode apparatus are examples, and may be modified as appropriate. Moreover, in the example, various values are indicated, but the values are also examples. Therefore, for example, when the specifications of a used laser diode are changed, the values are also changed.

It should be understood by those skilled in the art that various modifications, combinations, sub-combinations and alterations may occur depending on design requirements and other factors insofar as they are within the scope of the appended claims or the equivalents thereof.

What is claimed is:
1. A method of driving a laser diode comprising the steps of:
providing a laser diode that, when driven with a pulse current with an amperage that is 10 or more times higher than a threshold current amperage value of the laser diode, emits a laser beam with a first light peak and a following second light peak, the first light peak having a light intensity of at least 3 watts and a half-value width of at most 20 picoseconds, the second light peak having an energy of at least 1 nanojoule and a duration of at least 1 nanosecond;

generating, by means of a pulse generator, the pulse current with the amperage that is 10 or more times higher than the threshold current amperage value of the laser diode and driving the laser diode with the pulse current such that the laser diode emits the laser beam with (a) the first light peak having the light intensity of at least 3 watts and the half-value width of at most 20 picoseconds, and (b) the following second light peak having the energy of at least 1 nanojoule and the duration of at least 1 nanosecond.

2. The method of claim 1, wherein the width of the pulse current is 10 nanoseconds or less.

3. The method of claim 2, wherein:

the laser diode includes a laminate structure body including a first compound semiconductor layer, an active layer having a quantum well structure and a second compound semiconductor layer, a first electrode electrically connected to the first compound semiconductor layer, and a second electrode electrically connected to the second compound semiconductor layer; and the laminate structure body is made of an AlGaInN-based compound semiconductor.

4. The method of claim 1, wherein the value of the pulse current is 0.4 amperes or more.

5. The method of claim 4, wherein the laser diode includes a laminate structure body including a first compound semiconductor layer, an active layer having a quantum well structure and a second compound semiconductor layer, a first electrode electrically connected to the first compound semiconductor layer, and a second electrode electrically connected to the second compound semiconductor layer, and the laminate structure body is made of an AlGaInN-based compound semiconductor.

6. The method of claim 1, wherein the laser diode is a laser diode having a ridge stripe type separated confinement heterostructure.

7. The method of claim 1, wherein:

the laser diode includes a laminate structure body with a first compound semiconductor layer, an active layer having a quantum well structure and a second compound semiconductor layer, a first electrode electrically connected to the first compound semiconductor layer, and a second electrode electrically connected to the second compound semiconductor layer; and the laminate structure body is made of an AlGaInN-based compound semiconductor.

* * * * *